(12) United States Patent
Nakabayashi et al.

(10) Patent No.: US 6,468,817 B2
(45) Date of Patent: Oct. 22, 2002

(54) SEMICONDUCTOR INTEGRATED CIRCUIT DEVICE MANUFACTURING METHOD INCLUDING CHEMICAL MECHANICAL POLISHING, AND DETECTION AND EVALUATION OF MICROSCRATCHES CAUSED THEREBY

(75) Inventors: Shinichi Nakabayashi, Hitachinaka; Hisahiko Abe, Mito; Hirofumi Tsuchiyama, Hitachinaka; Yukio Kenbo, Tokyo; Yoshiteru Katsumura, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/934,561

(22) Filed: Aug. 23, 2001

(65) Prior Publication Data

US 2002/0042154 A1 Apr. 11, 2002

(30) Foreign Application Priority Data

Oct. 5, 2000 (JP) ........................................ 2000-306646

(51) Int. Cl.[7] .......................... H01L 21/66; G01R 31/26
(52) U.S. Cl. .......................... 438/14; 438/424; 438/692
(58) Field of Search ..................... 438/14, 692, 693, 438/424

(56) References Cited

U.S. PATENT DOCUMENTS

| | | | | |
|---|---|---|---|---|
| 4,238,275 A | * | 12/1980 | Shih | 252/79.1 |
| 4,944,836 A | | 7/1990 | Beyer et al. | 156/636 |
| 5,946,543 A | * | 8/1999 | Kimura et al. | 148/DIG. 162 |
| 6,048,771 A | * | 4/2000 | Lin et al. | 438/296 |
| 6,335,286 B1 | * | 1/2002 | Lansford | 156/345 |
| 6,337,279 B1 | * | 1/2002 | Huang et al. | 438/692 |

FOREIGN PATENT DOCUMENTS

JP 10-163284 6/1998 ............. H01L/21/66

OTHER PUBLICATIONS

Patent Abstracts of Japan 10163284 A Jun. 19, 1998.
"The Science of CMP", PP. 128–143, Kabushiki–Kaisha Science Forum, Jul. 19, 1999.

* cited by examiner

*Primary Examiner*—Richard Booth
*Assistant Examiner*—Angel Roman
(74) *Attorney, Agent, or Firm*—Antonelli, Terry, Stout & Kraus, LLP

(57) ABSTRACT

In the manufacturing method, micro scratches are detected without performing a breakdown inspection on wafers flowing through a mass production process. The method comprises: forming an insulating film on main surfaces of a plurality of first wafers which flow through a mass-production process; preparing a dummy wafer for monitoring, on which a silicon-oxide-based insulating film is formed; performing chemical mechanical polishing on the insulating films respectively formed on main surfaces of the plurality of first wafers and the dummy wafer; performing etching on the insulating film of the dummy wafer with use of a solution containing hydrofluoric acid, after the step of performing the chemical mechanical polishing; and measuring a number of scratches on the insulating film of the dummy wafer subjected to the etching.

12 Claims, 17 Drawing Sheets

SEMICONDUCTOR INTEGRATED CIRCUIT DEVICE MANUFACTURING METHOD INCLUDING CHEMICAL MECHANICAL POLISHING, AND DETECTION AND EVALUATION OF MICROSCRATCHES CAUSED THEREBY

TECHNICAL FIELD OF THE INVENTION

The present invention relates to a technique for manufacturing a semiconductor integrated circuit device, and particularly, to a technique which can effectively be used for manufacturing a semiconductor integrated circuit device, including a step of polishing a thin film formed on a surface of a semiconductor wafer with use of CMP (Chemical Mechanical Polishing).

BACKGROUND OF THE INVENTION

The chemical mechanical polishing is a new micro processing technique involved by high integration and high performance of a semiconductor integrated circuit device (LSI). For example, this technique is adopted to formation of an element separation groove called SGI (Shallow Groove Isolation) and flattening of an interlayer insulating film in a multi-layered wire forming step and forming of an imbedded metal wiring. This chemical mechanical polishing is described, for example, in U.S. Pat. No. 4,944,836.

The chemical mechanical polishing is a method in which the surface of a wafer is polished while supplying polishing slurry onto a surface plate to which a polishing pad made of hard resins is adhered. Used as the polishing slurry is a resultant obtained by dispersing micro grains of a polishing agent such as silica (silicon oxide) or the like in pure water and by adding alkali for adjusting pH thereto. Known as silica contained in the polishing slurry are fumed silica (aerosol silica) obtained by burning silicon tetrachloride ($SiCl_4$) and colloidal silica obtained from sodium silicate as a raw material ("The Science of CMP", pages 128 to 142, issued from Kabushiki-Kaisha Science Forum, Jul. 19, 1999).

Japanese Patent Laid-Open Publication No. 10-163284 discloses a wafer surface inspection method for determining whether the number of particles is the number of actual particles or the number including a scratch when particles remaining on the wafer surface after chemical mechanical polishing and cleaning processing are counted by a particle counter.

SUMMARY OF THE INVENTION

Recently, chemical mechanical polishing for LSI is carried out through a plurality of steps in a wafer process, in order to promote downsizing of elements and multi-layering. For example, in a step of forming an element separation groove in the main surface of a wafer, firstly, the main surface of the wafer is dry-etched, using an oxidation resistant insulating film as a mask, thereby to form a groove in the element separation region. Subsequently, a silicon oxide film having a greater film thickness than the depth of the groove is formed on the main surface of the wafer, and thereafter, the silicon oxide film is subjected to chemical mechanical polishing, using the oxidation-resistant insulating film as a stopper for polishing, so that the silicon oxide film selectively remain inside the groove. An element separation groove is thus formed. Also, in a step of flattening an inter-layer insulating film between a gate electrode and a wire above the gate electrode or between multi-layered wires, a method based on chemical mechanical polishing of a silicon oxide film has come to be used frequently in place of a flattening method using a conventional spin-on-glass (SOG) film.

When the chemical mechanical polishing is adopted to a step of manufacturing an LSI, the quality of the wafer after polishing is an important problem. Representative problems for qualities of wafers after polishing are (1) Scratch, (2) Sticking foreign materials (particles), (3) Uniformity (flatness), and the like.

The (1) scratch is roughly classified into macro scratch and micro scratch. The former is considered to be caused by fall of grinder particles from a diamond dresser used for dressing the polishing pad. The latter is mainly caused by a large agglomerate contained in polishing slurry or clogging of the polishing pad.

In addition, particles contained in the polishing slurry such as grinder particles and a large amount of alkali metal ions remain on the wafer surface after polishing. Therefore, cleaning processing (post cleaning) after polishing must be carried out under sufficient management to remove (2) sticking foreign materials (particles).

In the step of polishing a silicon oxide film as described above, polishing slurry obtained by dispersing silica particles in water is used generally. A hydrophilic silanol group (Si—OH) exists on the surface of silica. Therefore, when silica particles are dispersed in water, cohesion of particles (primary particles) occurs due to the hydrogen bond between particles and the force of van der Waals, so that agglomerates (secondary particles) having a greater grain diameter than a single particle are formed. Therefore, in case of polishing slurry obtained by dispersing silica particles (dispersoid) in water (dispersion medium), the agglomerates constitute components of grinder particles.

The agglomerates do not cause any problem if they have a relatively small grain diameter. However, since some huge agglomerates having a grain diameter of 1 $\mu$m or more exist in the polishing slurry in practice, they cause a very small scratch called a micro scratch on the surface of the wafer, thereby to cause lowering of the yield and reliability. Particularly, in the step of forming an element separation groove described above, a thin oxidation-resistant insulating film formed on the wafer surface is used as a stopper for polishing, to polish the silicon oxide film. Therefore, if a micro scratch occurs on the surface of the oxidation-resistant insulating film, it reaches the silicon substrate as a ground layer, causing deterioration in characteristics of the transistor and etching residues during processing of a gate.

As has been described above, micro scratches are mainly caused by agglomerates in polishing slurry. Therefore, the number of agglomerates is reduced, for example, by a method in which an interface acting agent is added to polishing slurry to improve dispersibility of silica particles, a method in which polishing slurry is filtered to remove agglomerates, or the like. However, even this kind of countermeasure is taken, micro scratches may be caused when the polishing condition is changed, e.g., when the lot of the polishing slurry is changed or when the polishing pad is repapered.

As a countermeasure against micro scratches, a proposal has been made of a grinding grain free polishing method which does not contain grinding particles as a component such as silica or the like or the concentration of the grinding component is lowered very much (for example, Japanese Patent Application No. 10-317233). However, since the range to which this method is applicable is limited, polishing slurry containing grinding particles as a component must be used in the current mass-production wafer process.

Consequently, in order to prevent deterioration of the yield and reliability due to micro scratches, occurrence of a micro scratch must be found in a stage which is as early as possible after the chemical mechanical polishing processing, the factor causing the occurrence of the micro scratch must be found, and appropriate polishing conditions must be selected.

However, since micro scratches have a very small size, it is very difficult to detect and check occurrence of a micro scratch immediately after polishing. In most cases, abnormality caused by a micro scratch is found only after several steps or at the time of an inspection on a cross-section which is carried out in the final inspection step of a wafer process. Therefore, there is a problem that a large number of wafers have become defective when a defect caused by a micro scratch is found in the mass-production wafer process in which chemical mechanical polishing is carried out.

An object of the present invention is to provide a technique capable of detecting occurrence of micro scratches in a stage which is as early as possible after chemical mechanical polishing processing in a mass-production wafer process.

Another object of the present invention is to provide a technique capable of detecting micro scratches, without performing a breakdown inspection on product wafers flowing through a mass-production process.

Further another object of the present invention is to provide a technique for evaluating micro scratches, which is matched with mass-production of integrated circuit devices each having a micro pattern.

Further another object of the present invention is to provide a technique of restricting deterioration of the yield and reliability of integrated circuit devices, which is caused by micro scratches.

The above-described objects and other objects of the present invention and novel features thereof will be clearly understood from the description of the present specification and the drawings attached herein.

Schematic of representative one of the inventions disclosed in the present application will be briefly explained as follows.

According to an aspect of the present invention, a method of manufacturing a semiconductor integrated circuit device comprises: a step (a) of forming an insulating film on a main surface of a plurality of first wafers which flow through a mass-production process; a step (b) of preparing a dummy wafer for monitoring, on which a silicon-oxide-based insulating film is formed; a step (c) of performing chemical mechanical polishing processing on the insulating films respectively formed on main surfaces of the plurality of first wafers and the dummy wafer; a step (d) of performing etching processing on the insulating film of the dummy wafer with use of a solution containing hydrofluoric acid, after the step (c) of performing the chemical mechanical polishing processing; and a step (e) of measuring a number of scratches on the insulating film of the dummy wafer subjected to the etching processing, thereby to manage the number of scratches formed in the insulating films of the plurality of first wafers in the step (c) of performing the chemical mechanical polishing processing.

In the present application, the chemical mechanical polishing (CMP) generally means that polishing is carried out, supplying polishing slurry, while the surface to be polished is kept in contact with a polishing pad made of a sheet material such as a soft cloth or the like.

The polishing slurry generally means a suspension liquid in a liquid colloid state in which micro grains of a polishing agent (dispersoid) is mixed in water and a chemical etching agent (dispersion medium). The micro grains of a polishing agent are generally micro grains of silica, ceria, zirconia, alumina, or the like.

The polished flattened insulating film separation grooves mean element separation grooves which are formed in such a manner that an insulating film having a flattened surface is let selectively remain in the grooves. Therefore, element separation grooves which are formed merely by simply depositing an insulating film inside grooves do not meet the polished flattened insulating film separation grooves used herein. For example, element separation grooves generally called SGI (Shallow Groove Isolation) or STI (Shallow Trench Isolation) meet the polished flattened insulating film separation grooves used herein.

In the present application, the mass-production process on a wafer line indicates a case where the throughput of a specific chemical mechanical polishing device used on the wafer line for one day is at least 25 sheets or more, 50 sheets or more, or more generally 100 sheets or more, calculated by 8-inch wafers. Needless to say, this limit number of sheets is in inverse proportion to the area of the wafer.

The dummy wafer or monitor wafer does not means a wafer on which an integrated circuit device as a product is formed (called also a product wafer in the present application) but means a wafer used for determining whether a product wafer which has passed through a specific manufacturing process (e.g., the chemical mechanical polishing step in the present application) is non-defective or defective.

In the embodiment described later, explanation will be divided into a plurality of sections or embodiments if it is necessary for conveniences. Except for the case where a clear indication is specially given, they are related with each other, and there is a relationship that one section or embodiment is a modification, specification, or supplementary explanation of part or all of another section or embodiment.

Further, where the following embodiment deals with a numerical expression (including a number, a numerical value, amount, range, and the like) concerning components, the numerical expression is not limited to the specific number but may be greater or smaller than the specific number, except for the case that a specific indication is given and the case that the expression is apparently limited to a specific number on principles. Further, in the following embodiment, structural components thereof (including componential steps and the like) are not always essential except for the case that a specific indication is given and the case that they are considered to be essential on principles.

Likewise, where the following embodiment deals with the shape of a structural component, positional relationship thereof, or the like, the embodiment covers such a component that is approximate or similar to the shape or the like, except for case that a clear indication is specially given and the case that such a component is apparently considered to be different on principles. This also applies to numerical values and ranges described above.

The semiconductor integrated circuit device used in the present application includes not only components that are formed on a monocrystal silicon substrate but also all other components formed on other substrates, such as an SOI (Silicon On Insulator) substrate, a TFT (Thin Film Transistor) liquid crystal manufacture substrate, and the like, except for the case that a clear denial indication is specially given. In addition, the wafer indicates a monocrystal silicon substrate (generally having a disk-like shape), an SOI substrate, a glass substrate, an insulating or semi-insulating substrate, a semiconductor substrate, or a composite substrate thereof, which is used for manufacturing a semiconductor integrated circuit device.

BRIEF DESCRIPTIONS OF THE DRAWINGS

Figure 22:
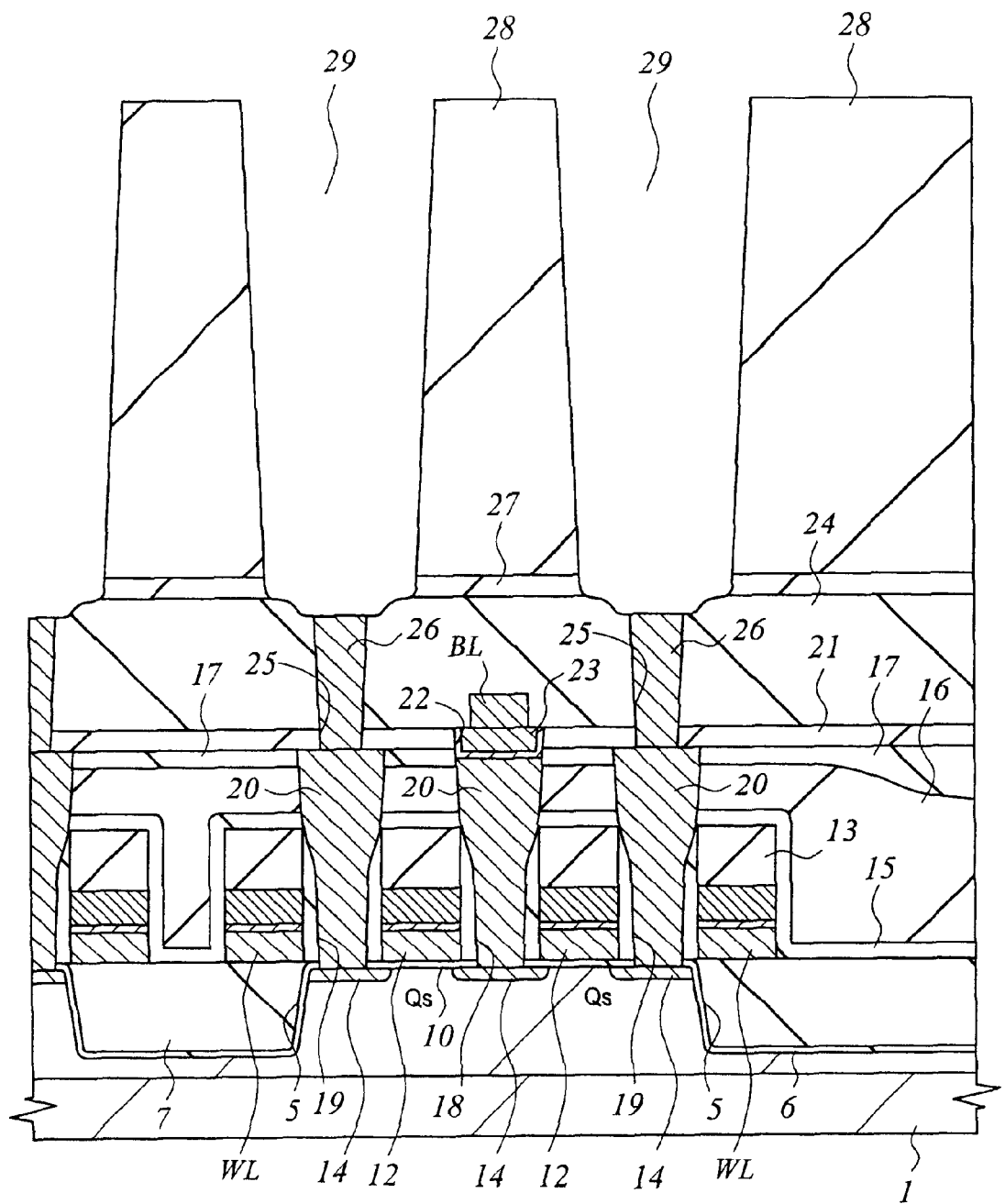
Figure 23:
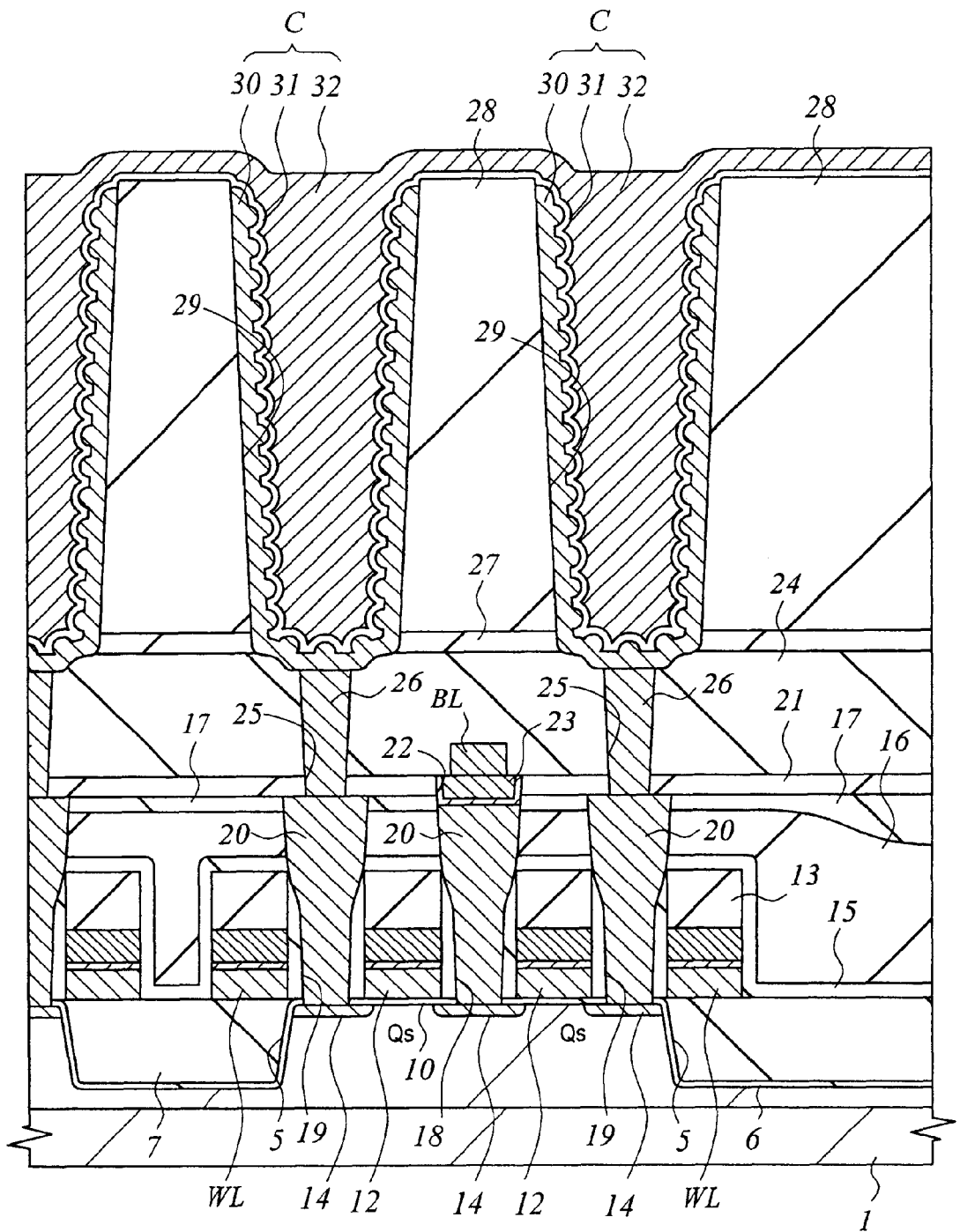

FIG. 22 is also a cross-sectional view of a main part of a silicon substrate, showing the method of manufacturing a semiconductor integrated circuit device as the embodiment of the present invention; and FIG. 23 is also a cross-sectional view of a main part of a silicon substrate, showing the method of manufacturing a semiconductor integrated circuit device as the embodiment of the present invention.

DESCRIPTION OF THE PREFERRED EMBODIMENTS

In the following, an embodiment of the present invention will be specifically explained on the basis of the drawings. In all figures that explain the embodiment, common parts are respectively denoted at common reference symbols, and reiterative explanation thereof will be omitted herefrom.

A method of manufacturing a DRAM (Dynamic Random Access Memory) as an embodiment of the present invention will be explained in the order of manufacturing steps with reference to FIGS. 1 to 23.

Figure 1:
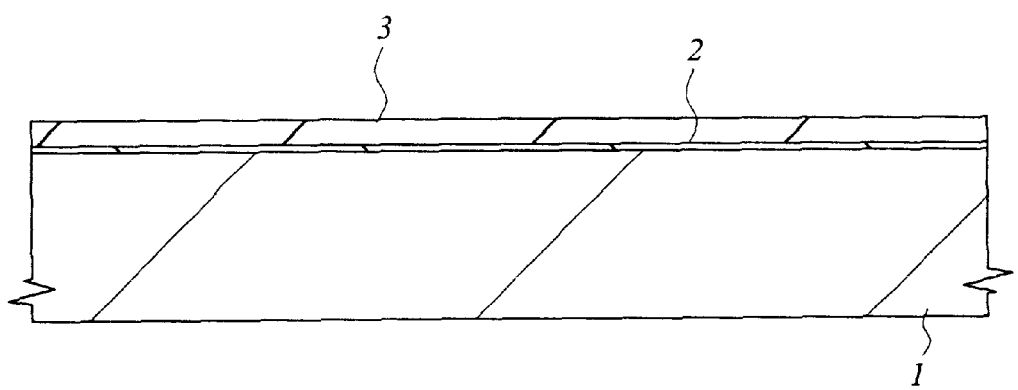
FIG. 1 is a cross-sectional view of a main part of a silicon substrate, showing a method of manufacturing a semiconductor integrated circuit device as an embodiment of the present invention.

At first, as shown in FIG. 1, a substrate (wafer) 1 made of p-type polycrystal silicon having high resistivity of about 1 to 10 ωcm is thermally oxidized at about 850° C., to form a thin silicon oxide film 2 having a film thickness of about 10 nm. Thereafter, a silicon nitride film (oxidation-resistant film) 3 having a film thickness of about 120 nm is formed on the silicon oxide film 2 by a CVD method.

The silicon nitride film 3 is used as a mask when a trench is formed by etching the substrate 1 in the element separation region. The silicon nitride film 3 has a characteristic that it is hardly oxidized, so that it is used also as a mask which prevents oxidation of the surface of the substrate 1 thereunder. The silicon oxide film 2 under the silicon nitride film 3 is formed to relax stress generated at the interface between the substrate 1 and the silicon nitride film 2 and to prevent defects surface as dislocation or the like from occurring on the surface of the substrate 1 due to the stress.

Figure 2:
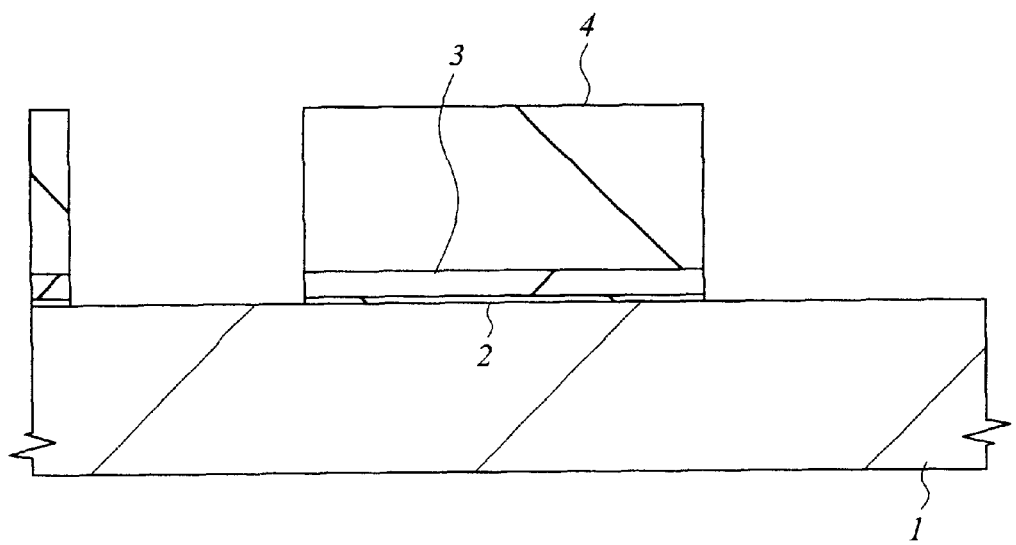
FIG. 2 is also a cross-sectional view of a main part of a silicon substrate, showing the method of manufacturing a semiconductor integrated circuit device as the embodiment of the present invention.
Figure 3:
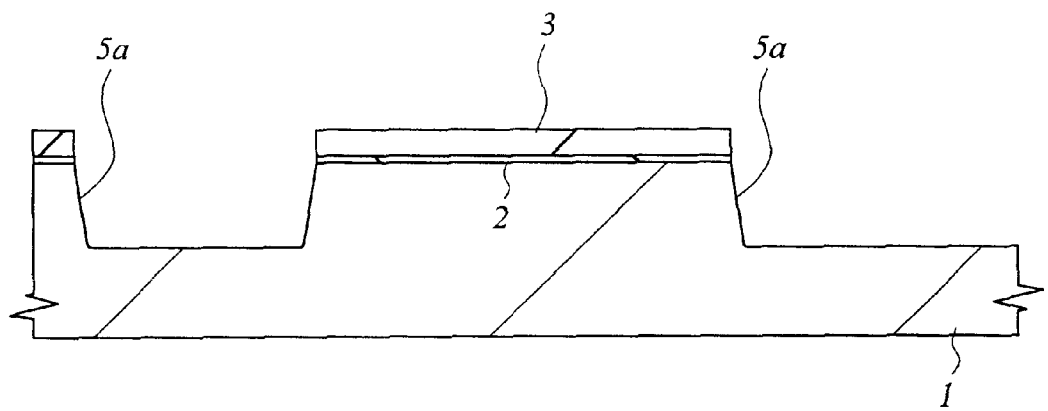
FIG. 3 is also a cross-sectional view of a main part of a silicon substrate, showing the method of manufacturing a semiconductor integrated circuit device as the embodiment of the present invention.

Next, as shown in FIG. 2, the silicon nitride film 3 at the element separation. region and the silicon oxide film 2 thereunder are selectively removed by dry-etching with a photoresist film 4 used as a mask. Thereafter, as shown in FIG. 3, a groove 5a having a depth of about 350 nm is formed in the substrate 1 at the element separation region, by dry-etching with the silicon nitride film 3 used as a mask.

Figure 4:
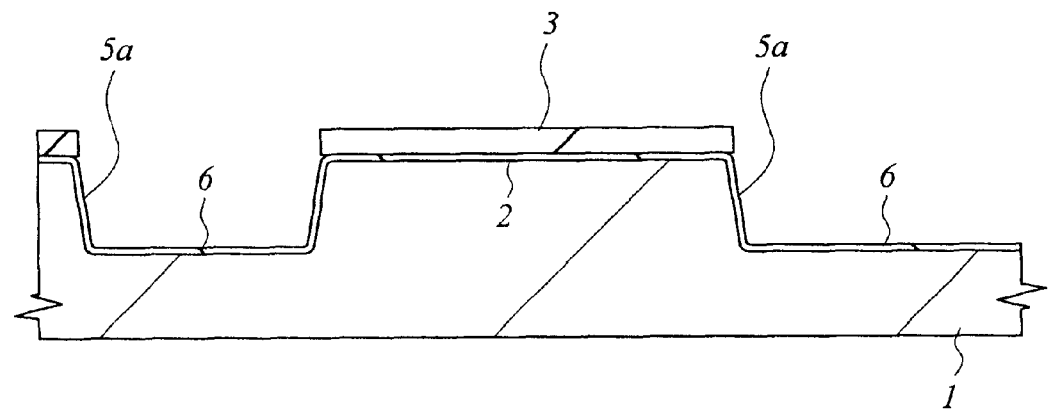
FIG. 4 is also a cross-sectional view of a main part of a silicon substrate, showing the method of manufacturing a semiconductor integrated circuit device as the embodiment of the present invention.

Next, the photoresist film 4 is removed. Thereafter, as shown in FIG. 4, the substrate 1 is thermally oxidized at about 800 to 1000° C. to form a thin silicon oxide film 6 having a film thickness of about 10 nm on the inner wall of the groove 5a. This silicon oxide film 6 is formed to recover damages of the dry-etching and to relax stress generated at the interface between the silicon oxide film 7 embedded in the groove 5a in a later step and the substrate 1.

Figure 5:
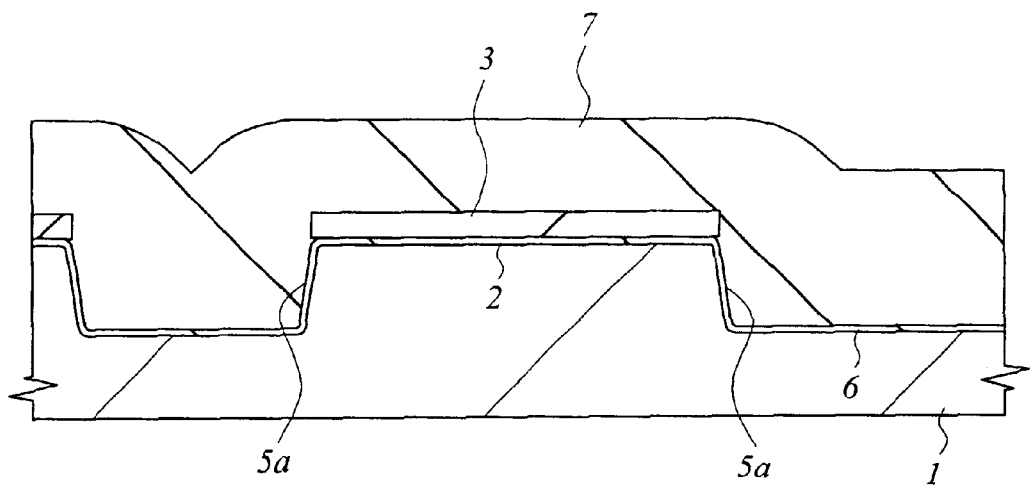
FIG. 5 is also a cross-sectional view of a main par of a silicon substrate, showing the method of manufacturing a semiconductor integrated circuit device as the embodiment of the present invention.

Next, as shown in FIG. 5, a silicon oxide film 7 is deposited on the substrate 1 including the inside of the groove 5a, by the CVD method. This silicon oxide film 7 is deposited with a film thickness (e.g., 500 nm to 600 nm) which is thicker than the depth of the groove 5a, so that the inside of the groove 5a is filled with the silicon oxide film 7 so as to leave no gap. The silicon oxide film 7 is, for example, made of a film having an excellent step coverage (gap covering characteristic) like a silicon oxide film (hereinafter called p-TEOS film) formed by a plasma CVD method using, for example, oxygen and tetraethoxysilane $((C_2H_5)_4Si)$.

Figure 6:
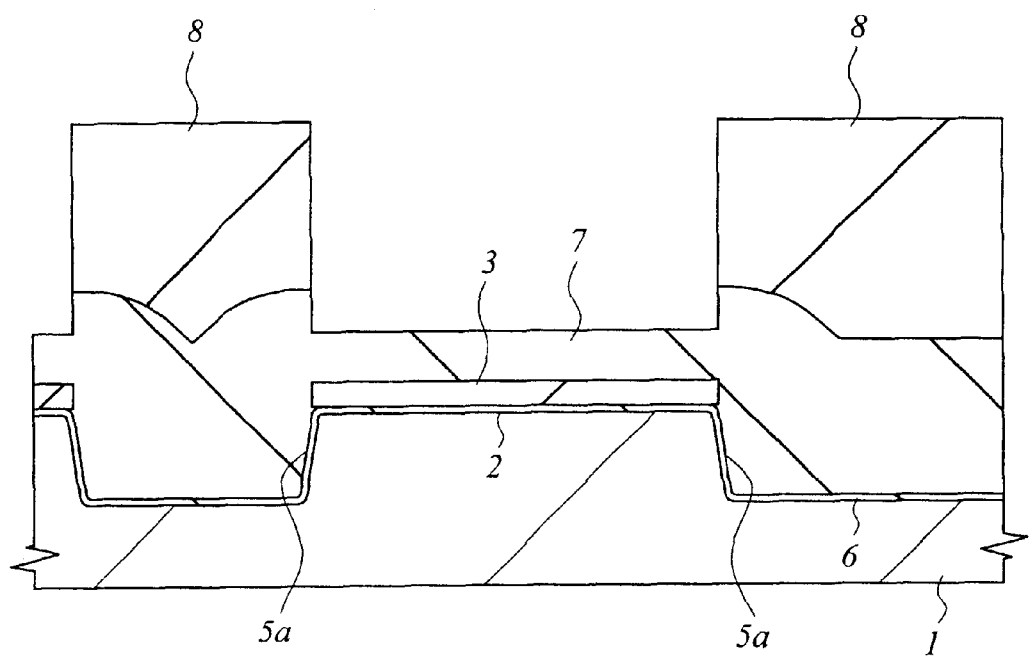
FIG. 6 is also a cross-sectional view of a main part of a silicon substrate, showing the method of manufacturing a semiconductor integrated circuit device as the embodiment of the present invention.

Next, the substrate 1 is thermally oxidized at about 1000° C. thereby to carry out densification (sintering) processing for improving the film quality of the silicon oxide film 7 filled in the groove 5a. Thereafter, as shown in FIG. 6, the silicon oxide film 7 on the silicon nitride film 3 is dry-etched using the photoresist film 8 formed on the groove 5a as a mask. This dry-etching is carried out to equalize substantially the heights of the surface of the silicon oxide film 7 at upper parts of the groove 5a and the silicon nitride film 3.

Figure 7:
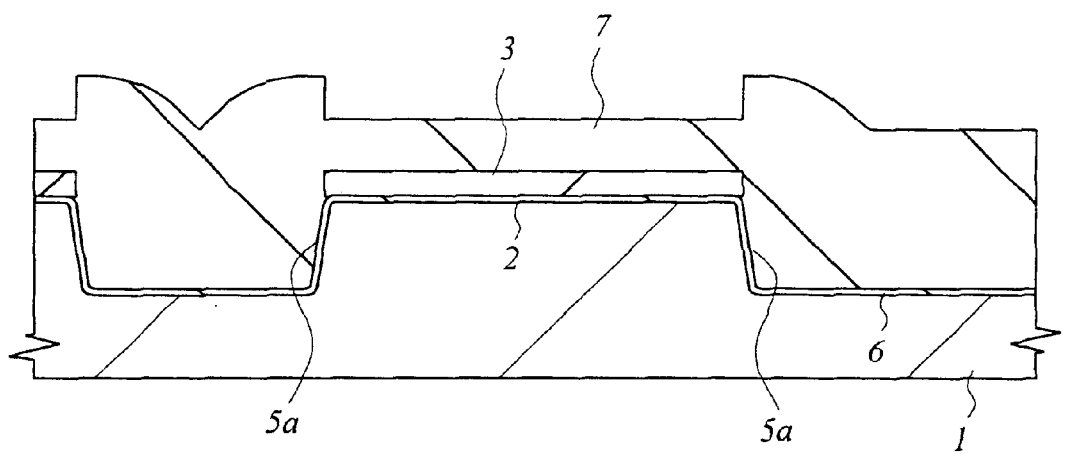
FIG. 7 is also a cross-sectional view of a main part of a silicon substrate, showing the method of manufacturing a semiconductor integrated circuit device as the embodiment of the present invention.

Next, as shown in FIG. 7, the photoresist film 8 above the silicon oxide film 7 is removed, and thereafter, the silicon oxide film 7 is subjected to chemical mechanical polishing by the method as follows.

Figure 8:
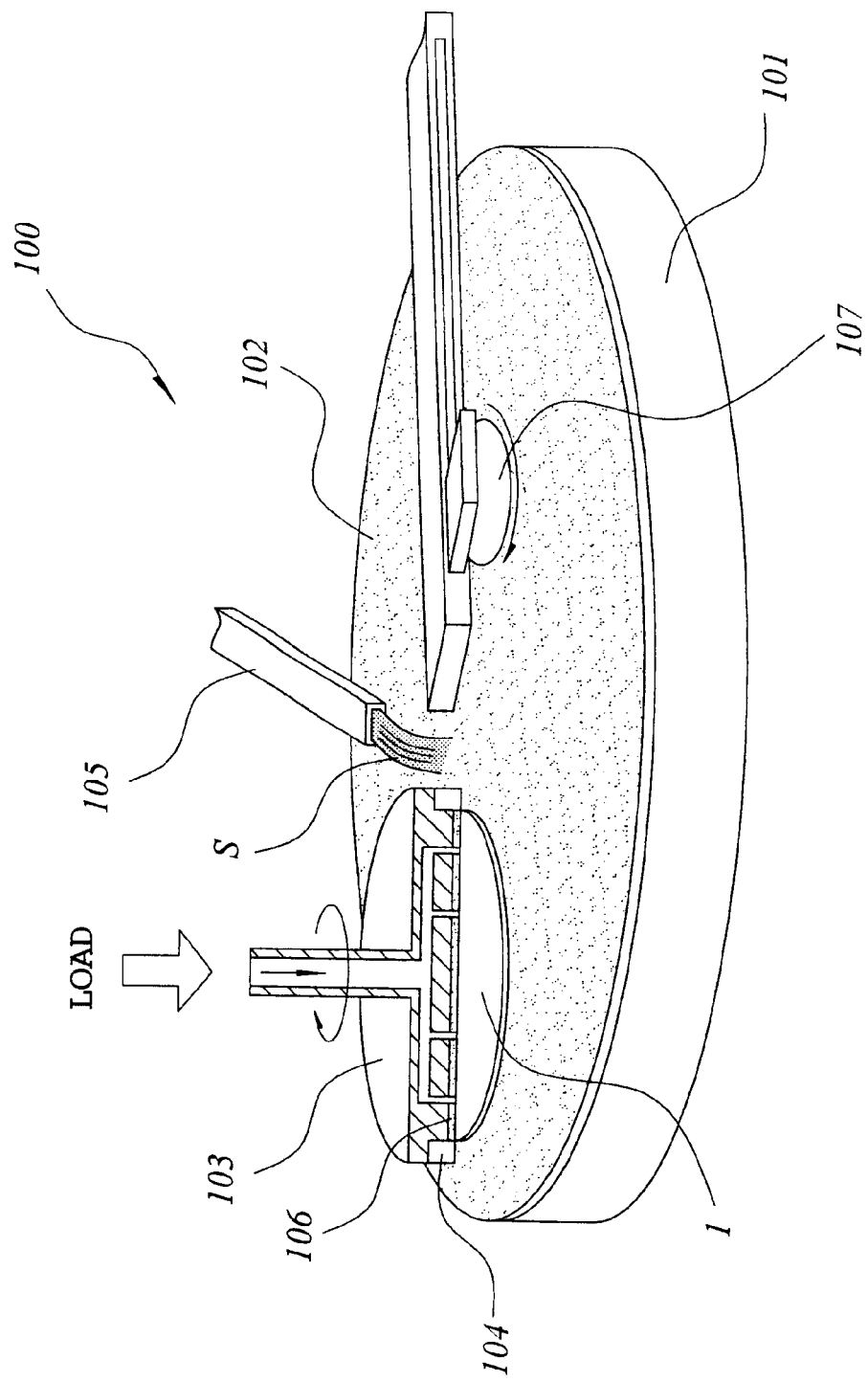
FIG. 8 is a schematic view showing a processing part of a chemical mechanical polishing device used for chemical mechanical polishing a silicon oxide film.

FIG. 8 shows a schematic view showing a processing part of a chemical mechanical polishing device 100 used for polishing the silicon oxide film 7. As shown in the figure, a surface plate 101 which performs polishing processing on the wafer (substrate) 1, sheet by sheet, is provided at the processing part.

The surface plate 101 is rotated and driven in a horizontal plane by a drive mechanism not shown. In addition, a polishing pad 102 made of synthetic resins such as polyurethane having a large number of pores is adhered to the upper surface of the surface plate 101.

A wafer carrier 103 which is moved up and down by a drive mechanism not shown and is rotated and driven up and down is provided above the surface plate 101. The wafer 1 is held with its main surface (to be polished) oriented downward, by a retainer ring 104 and a membrane 106 provided at a lower end part of the wafer carrier 103. The wafer 1 is also pressed against the polishing pad 102 at a predetermined load. Polishing slurry S is supplied between the surface of the polishing pad 102 and the surface to be polished of the wafer 1 through a slurry supply tube 105, and the surface to be polished of the wafer 1 is chemically and mechanically polished.

A dresser 107 which is moved up and down by a drive mechanism not shown and is rotated and driven in a horizontal plane is provided also above the surface plate 101. A base material to which diamond grains electrically stick is attached to a lower end part of the dresser 107, and the surface of the polishing pad 102 is periodically cut by this base material, to prevent clogging due to polishing particles.

The polishing slurry S used herein contains, for example, fumed silica as polishing grains at about 13 wt % and has pH adjusted close to 11 by adding ammonium hydroxide (NH$_4$OH). This polishing slurry S contains big agglomerates having a grain diameter of 1 μm or more which cause a micro scratch as a problem in the present invention. Consequently, when the polishing slurry S is supplied to the chemical mechanical polishing device 100, it is desirable to provide a filter for the piping system connecting the tank holding the polishing slurry S and the chemical mechanical polishing device 100 and to remove sufficiently big agglomerates and foreign materials in the polishing slurry S.

Also, occurrence of micro scratches can be effectively restricted if the slurry S supplied to the chemical mechanical polishing device 100 is used after confirming that the slurry is previously left still in a tank for at least 30 days or more, preferably 40 days or more, and more preferably 50 days or more, and that the number of big agglomerates having a grain diameter of 1 μm or more, which are contained in 0.5 cc of polishing slurry S, is 200,000 or less, preferably 50,000 or less, and more preferably 20,000 or less. When the polishing slurry S thus left still for the period described above is drained from the tank and transported to the chemical mechanical polishing device 100, a supernatant portion of the slurry at the level of 5 cm or higher and preferably 10 cm or higher from the bottom of the tank is drained off in order to avoid mixture of foreign materials and big agglomerates precipitated at the bottom part of the tank.

To leave polishing slurry still means that the polishing slurry S is filled in a tank and left still without applying operation of vibration, stirring, heating (accompanying physical transfer against convection). The above-described method of keeping the polishing slurry S is described in details in the Japanese Patent Application No. 2000-145379 by the present inventors.

Substrates (wafers) 1 which flow through mass production process are conveyed one after another into the processing chamber part of the chemical mechanical polishing device 100 and are once maintained at a lower end part of the wafer carrier 103. Thereafter, the silicon oxide film 7 deposited on the surface of each wafer is polished. The polishing condition is arranged, for example, such that load=250 g/cm$^2$, rotation speed of wafer carrier=30 rpm, rotation speed of surface plate=25 rpm, and flow amount of slurry=200 cc/min.

Figure 9:
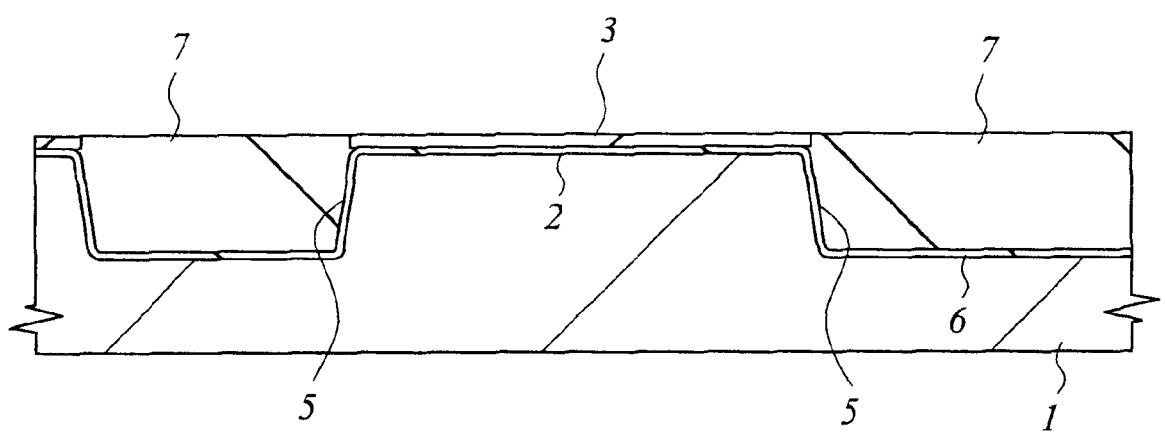
FIG. 9 is also a cross-sectional view of a main part of a silicon substrate, showing the method of manufacturing a semiconductor integrated circuit device as the embodiment of the present invention.

FIG. 9 shows a cross-sectional view of a substrate (wafer) 1 immediately after the chemical mechanical polishing processing is completed. Polishing of the silicon oxide film 7 is carried out using the silicon nitride film 3 as a stopper, and the time point when the film thickness of the silicon nitride film 3 reaches 60 nm is considered as an end point thereof. In this manner, an element separation groove 5 filled with the silicon oxide film 7 is formed in the element separation region on the main surface of the substrate (wafer) 1.

The substrates (wafer) 1 on which polishing processing is finished are put out from the wafer carrier 103, and is thereafter conveyed, one after another, to a cleaning device (not shown) connected in the rear stage of the chemical mechanical polishing device 100. Grinding grains of silica and alkali metal ions which are contained in the polishing slurry S are removed by a method such as pure-water scrubbing cleaning, pure-water ultrasonic wave cleaning, pure-water flow cleaning, pure-water spin cleaning, or the like. Further, the substrates (wafers) 1 are subjected to drying process using spin drying or IPA (isopropyl alcohol), and are thereafter conveyed to a next process. Meanwhile, new substrates (wafers) 1 on which the process shown in FIG. 7 has been completed are conveyed, one after another, into the chemical mechanical polishing device 100, and the chemical mechanical polishing processing as described is repeated.

In some substrates (wafers) 1 subjected to the chemical mechanical polishing processing, there is a case that a micro scratch occurs on the surface of the silicon oxide film 7 or the silicon nitride film 3 during polishing processing. The factor which causes micro scratches is big agglomerates and foreign materials in the polishing slurry S described above. The status of the dresser 107 or the polishing pad 102 may cause a micro scratch.

Hence, in the present embodiment, evaluation of micro scratches is carried out in the following method, with respect to substrates (wafers) 1 subjected to the chemical mechanical polishing processing.

Figure 10:
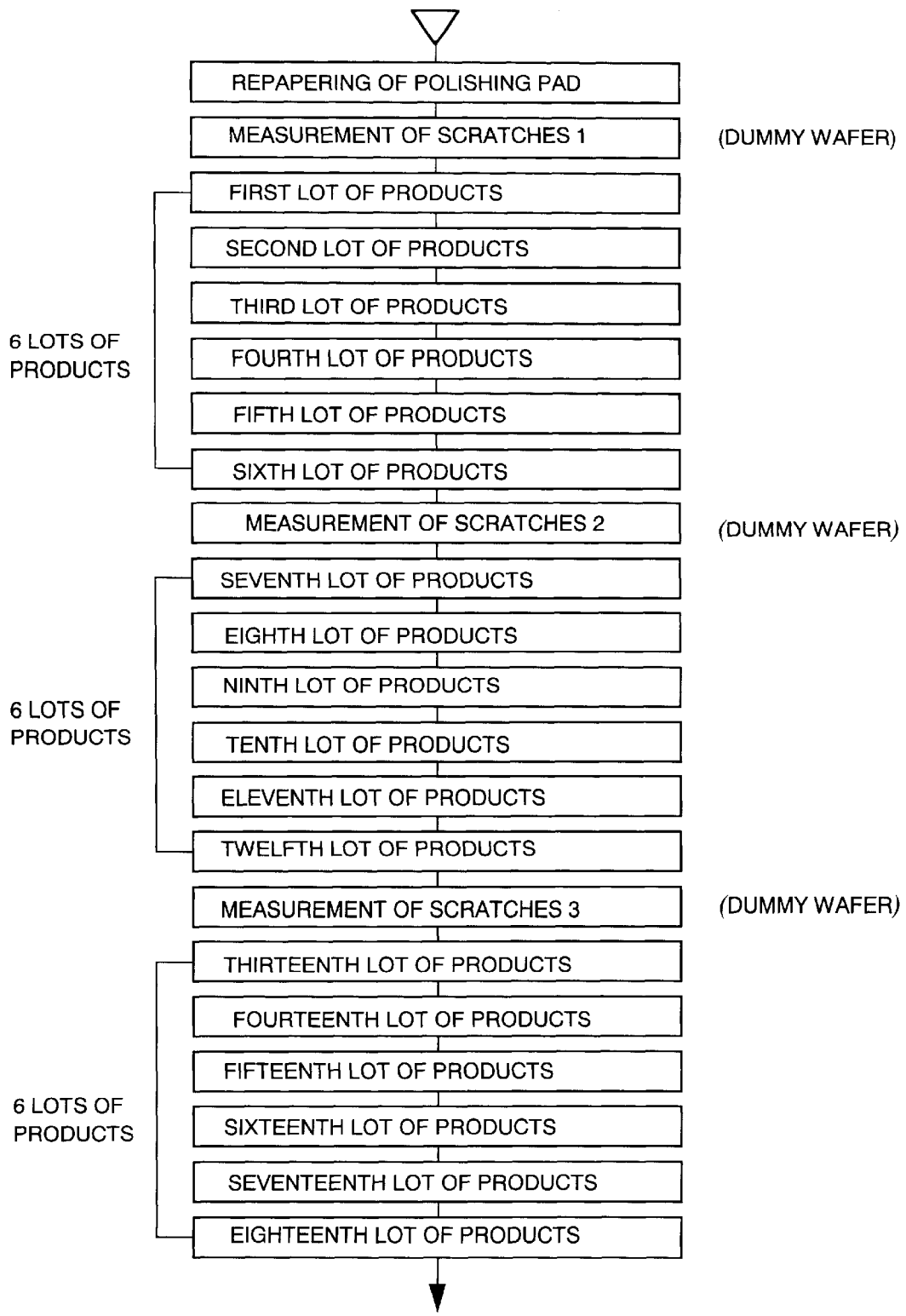
FIG. 10 is a flowchart showing a micro scratch measurement method according to the present invention.

FIG. 10 is a flowchart showing a micro-scratch measurement method. Explanation will now be made, supposing that the number of wafers of one lot which flow through the mass production process is set to 25, and measurement of scratches is carried out once every time when 6 lots (=150 sheets) of wafers are subjected to polishing processing. The present invention, however, is not limited thereto.

In the present embodiment, in order to avoid a case that those wafers that do not cause micro scratches or those wafers in which the number of micro scratches is equal to or less than a reference value are rendered defective by scratch measurement, micro scratches are measured with use of a dummy wafer (also called a monitor wafer). That is, wafers as targets of the scratch measurement are not commercial wafers which flow through mass-production process but are those wafers that are not used as products.

More specifically, a dummy wafer (monitor wafer) on which a silicon oxide film is deposited on the surface of a flat mirror-finished-surface wafer on which no circuit pattern is formed is prepared and let flow though the mass production process, together with product wafers. The dummy wafer is thus subjected to the chemical mechanical polishing processing and post-cleaning process. Further, the dummy wafer whose post-cleaning process has been finished is extracted from the mass-production line, and the surface of the silicon oxide film is etched with a solution containing hydrofluoric acid. At this time, if a micro scratch occurs on the surface of the silicon oxide film, it is enlarged by etching to have such a size that can be determined by a detection device. Hence, the number of enlarged scratch patterns is measured by a defect inspection device, to determine whether the number is on a non-defective level or a defective level. The standard is supposed that the etching time is about 1 min 20 sec to 1 min 30 sec in case of $HF:H_2O=1:19$, about 6 min in case of $HF:H_2O=1:99$, and about 30 min in case of $HF:H_2O=1:500$ (each at a normal temperature).

Measurement of scratches using a dummy wafer is carried out, for example, immediately after repapering of a polishing pad which is carried out periodically. That is, a dummy wafer set at the top of the first lot of product wafers. This dummy wafer is subjected to polishing processing immediately after repapering of a polishing pad. Further, this dummy wafer is processed with diluted hydrofluoric acid, to enlarge micro scratches, and the number of enlarged scratch patterns is measured. If the number of scratches is confirmed to be on the non-defective level, chemical mechanical polishing processing is carried out on the first to sixth lots of product wafers.

After the dummy wafer at the top of the seventh lot is subjected to polishing processing, the number of scratches is measured in the method described above. If the number of scratches is confirmed to be on the non-defective level, chemical mechanical polishing processing is performed on the seventh to twelfth lots of product wafers. Further, at the top of the thirteenth lot the number of micro scratches is confirmed to be on the non-defective level, chemical mechanical polishing processing is performed on the thirteenth to eighteenth lots of product wafers.

After chemical mechanical polishing processing is performed on the first to eighteenth lots of product wafers, the polishing pad is repapered. Further, the same processing as described above is performed on the nineteenth to thirty sixth lots of product wafers, the polishing pad is repapered, and the same processing is repeated. The explanation has been made supposing that the polishing pad is repapered once every time when 18 lots of wafers are processed. The present invention, however, is not limited thereto.

If the number of scratches of the dummy wafer at the top of the first lot is confirmed to be on the defective level, the chemical mechanical polishing processing on the first lot of product wafers is stopped, the factor which causes occurrence of micro scratches is specified and a countermeasure is discussed against the factor. Thereafter, the dummy wafer is used again to perform the scratch measurement as described above. Further, if the number of scratches of the dummy wafer is confirmed to be on the non-defective level, chemical mechanical polishing processing is performed on subsequent product wafers, and the scratch measurement described above is repeated at a rate of one measurement for every six lots.

Alternatively, if the dummy wafer at the top of the first lot is determined to be non-defective and if, in the scratch measurement using the dummy wafer at the top of the seventh lot, the dummy wafer is determined to be defective, the first to sixth lots of product wafers are regarded as scratch-doubt products (wafers in which the number of scratches may reach the non-defective level). The scratch-doubt products are subjected to determination as to whether they are non-defective or defective by performing an outer appearance inspection after the mass production process passes up to a step in which an outer appearance inspection is possible with respect to mass-product wafers. Also, in this case, chemical mechanical polishing processing on product wafers of the seventh and subsequent lots is stopped. The factor which causes micro scratches is then specified and a countermeasure against the factor is discussed. Thereafter, scratch measurement is carried out again with use of a dummy wafer. Further, if the dummy wafer is confirmed to be non-defective, chemical mechanical polishing processing is performed on product wafers of the seventh and subsequent lots. In the same manner as described above, chemical mechanical polishing is continued with respect to subsequent product wafers until any dummy wafer is confirmed to be defective while scratch measurement is carried out once for every six lots.

Figure 11:
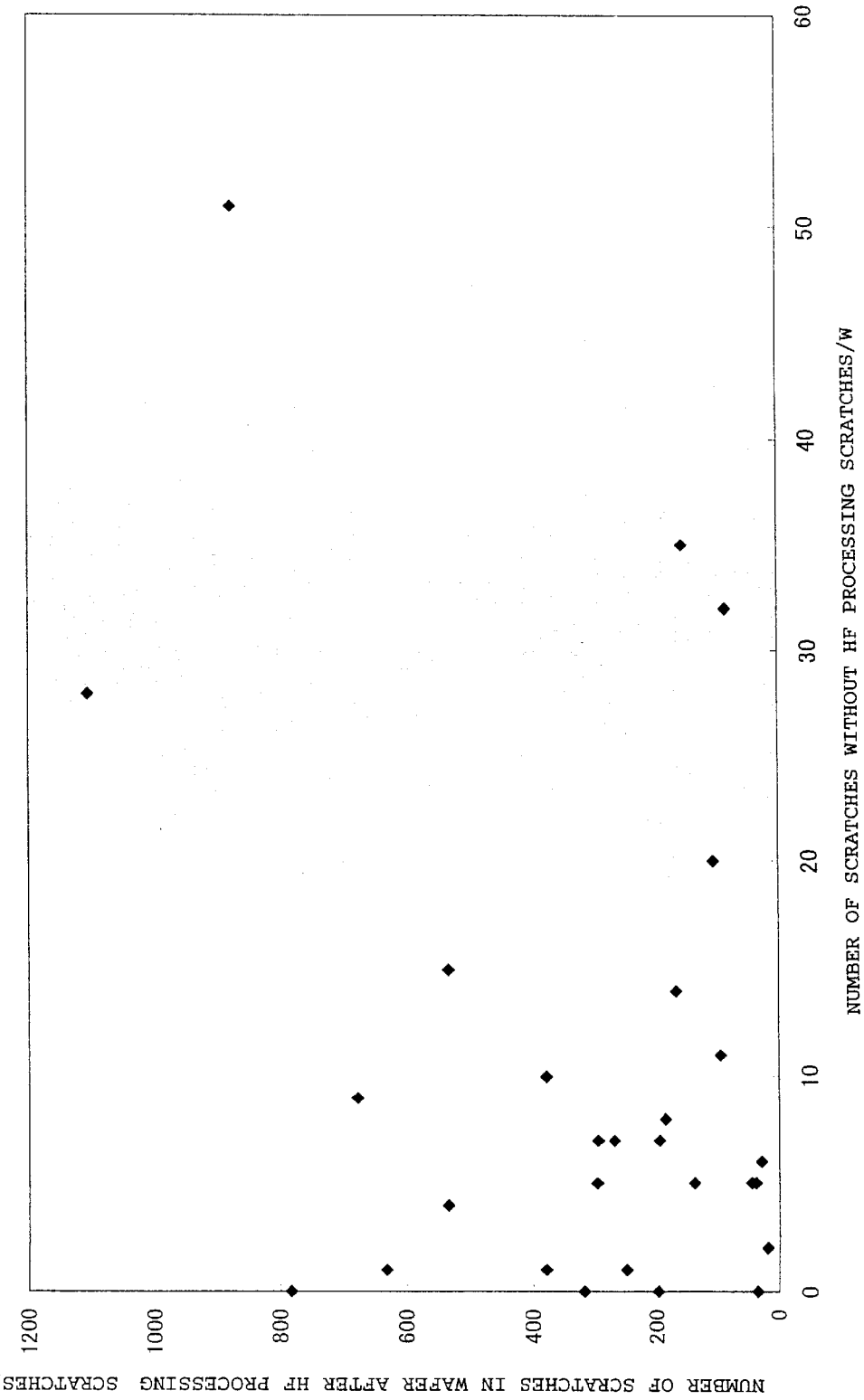
FIG. 11 is a graph showing a result of evaluating a relationship between hydrofluoric acid processing and the number of measured scratches.

FIG. 11 shows an experimental result of evaluating what difference occurs between a case where hydrofluoric acid processing is carried out and a case where this processing is not carried out, after a dummy wafer in which a silicon oxide film is deposited on the surface of the mirror-finished-surface wafer is subjected to chemical mechanical polishing processing. The used dummy wafer had a p-TEOS film having a film thickness of 1200 nm deposited on the surface of the mirror-finished-surface wafer having a diameter of 8 inches, and hydrofluoric acid processing is carried out by etching it with diluted hydrofluoric acid (HF:H$_2$O=1:99) for six minutes (the etching amount of the p-TEOS film is about 30 nm to 70 nm). The laser irradiation type defect inspection apparatus (LS-6510) manufactured by HITACHI ELECTRONICS ENGINEERING CO., LTD. was used for the scratch measurement.

As shown in the figure, no interrelation is confirmed between the case where hydrofluoric acid processing was carried out and the case where the processing was not carried out. It is, however, found that a dummy wafer on which hydrofluoric acid was carried out includes a larger number of measured scratches than a dummy wafer on which hydrofluoric acid processing was not carried out. In addition, the following is found. That is, even in case where scratch measurement is performed on a dummy wafer on which hydrofluoric acid processing had not been performed was carried out and the number of scratched was small, the number of scratches increases if scratch measurement is carried out again after hydrofluoric acid processing is thereafter carried out. Hence, it is confirmed from this experiment that it is difficult to perform evaluation of micro scratches without performing hydrofluoric acid processing, after chemical mechanical polishing, and hydrofluoric acid processing is very effective for correct measurement of the number of micro scratches which have occurred.

At the time point immediately after chemical mechanical polishing processing, it is not clear whether or not the number of micro scratches of each product wafer regarded as a scratch-doubt product (wafer in which the number of scratches may reach the non-defective level) actually reaches a non-defective level. In order to measure correctly the number of micro scratches on a product wafer, hydrofluoric acid processing must be carried out on a product wafer so that the scratches are enlarged. If hydrofluoric acid processing is carried out on product wafers immediately after chemical mechanical polishing processing, all product wafers are rendered defective by this processing. Therefore, scratch measurement to be performed on product wafers regarded as scratch-doubt products must be carried out in a step in which hydrofluoric acid processing can be performed on product wafers.

Hence, product wafers regarded as scratch-doubt products are conveyed to a next step, together with those products wafers not regarded as scratch-doubt products (wafers in which the number of micro scratches is confirmed to be on a nondefective level). In the following, brief explanation will be made with respect to steps up to a step in which an outer appearance inspection is performed on product wafers regarded as scratch-doubt products.

Figure 12:
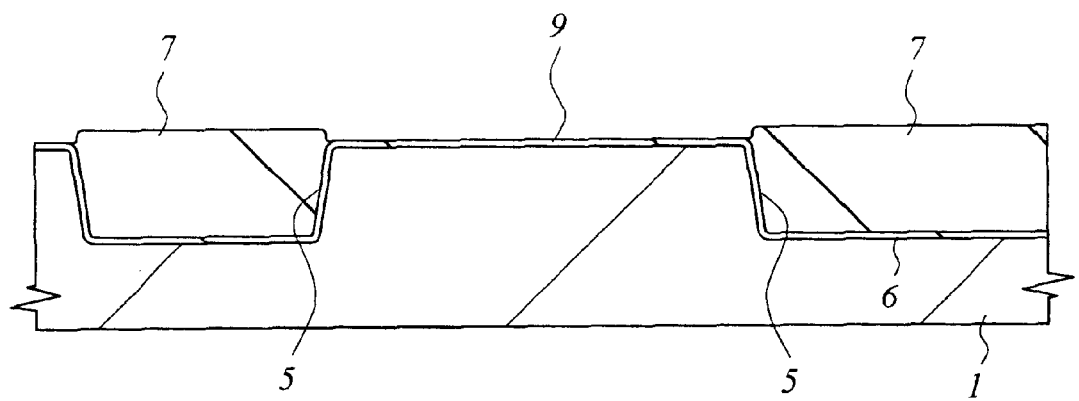
FIG. 12 is a cross-sectional view of a main part of a silicon substrate, showing the method of manufacturing a semiconductor integrated circuit device as the embodiment of the present invention.

At first, as shown in FIG. 12, the silicon nitride film 3 is removed with use of thermal phosphoric acid. Subsequently, the silicon oxide film 2 at a lower part of the silicon nitride film 3 is removed by hydrofluoric acid. Thereafter, the substrate 1 is thermally oxidized at about 800 to 1000° C., thereby to form a silicon oxide film 9 having a film thickness of about 10 nm on the surface of an active region. This silicon oxide film 9 is formed to prevent damages made on the surface of the substrate 1 when impurity ions are injected into the substrate 1 in a next step. Note that an outer appearance inspection described later may be performed on product wafers immediately after the silicon oxide film 2 is removed by hydrofluoric acid.

Figure 13:
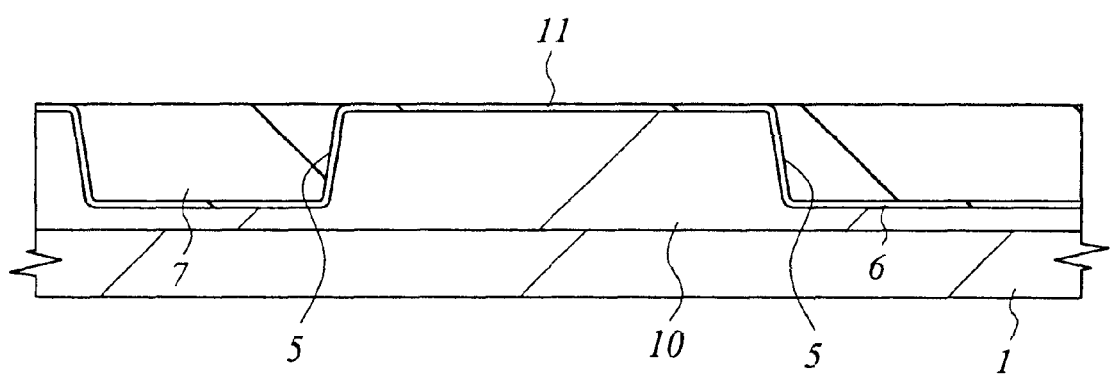
FIG. 13 is also a cross-sectional view of a main part of a silicon substrate, showing the method of manufacturing a semiconductor integrated circuit device as the embodiment of the present invention.

Next, as shown in FIG. 13, boron (B) is ion-implanted into the substrate 1 through the silicon oxide film 9, to form a p-type well 10. Subsequently, the silicon oxide film 9 is removed by hydrofluoric acid, and thereafter, the substrate 1 is thermally oxidized at about 800 to 850° C., thereby to form a clean gate oxide film 11 having a film thickness of about 6 to 8 nm on the surface of the active region. Although an outer appearance inspection described later may be performed on product wafers immediately after the silicon oxide film 9 is removed by hydrofluoric acid, there is a risk that pollution of the gate oxide film 11 may be incurred.

Figure 14:
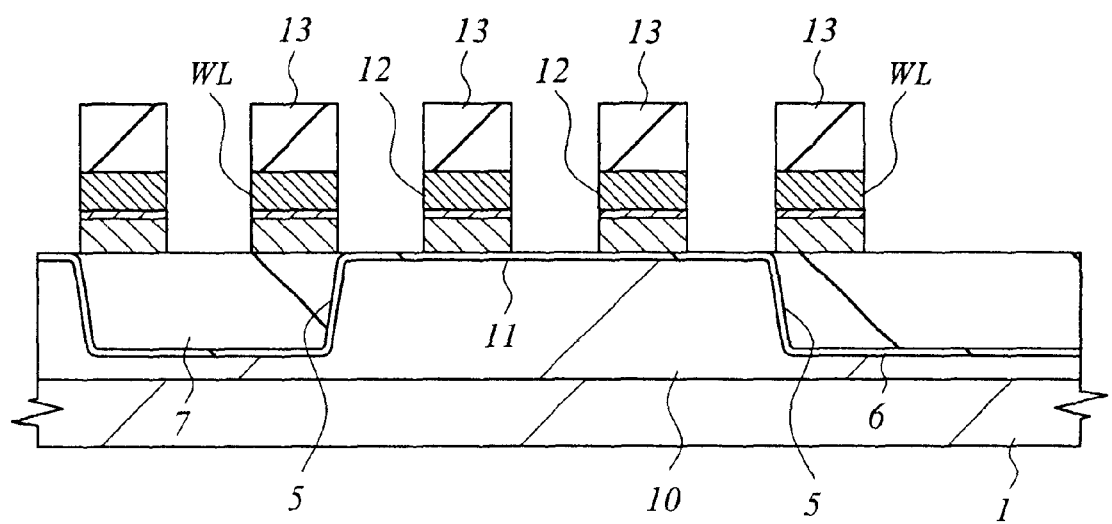
FIG. 14 is also a cross-sectional view of a main part of a silicon substrate, showing the method of manufacturing a semiconductor integrated circuit device as the embodiment of the present invention.

Next, as shown in FIG. 14, a gate electrode 12 (word line WL) is formed on the upper part of the gate oxide film 11. The gate electrode 12 (word line WL) is formed, for example, by depositing a polycrystal silicon film having a film thickness of about 50 nm and doped with phosphorus (P) on the gate oxide film 11, subsequently depositing a WSi$_2$ (tungsten silicide) film having a film thickness of about 120 nm thereon by a sputtering method, further depositing a silicon nitride film 13 having a film thickness of about 160 nm by a CVD method thereon, and thereafter patterning these films by dry etching with a photoresist film (not shown) used as a mask.

Next, the surface of the gate oxide film 11 is cleaned with hydrofluoric acid in order to remove etching residues. In the present embodiment, product wafers regarded as scratch-doubt products by the scratch measurement method are subjected to an outer appearance inspection, after cleaning with use of the hydrofluoric acid.

Figure 15:
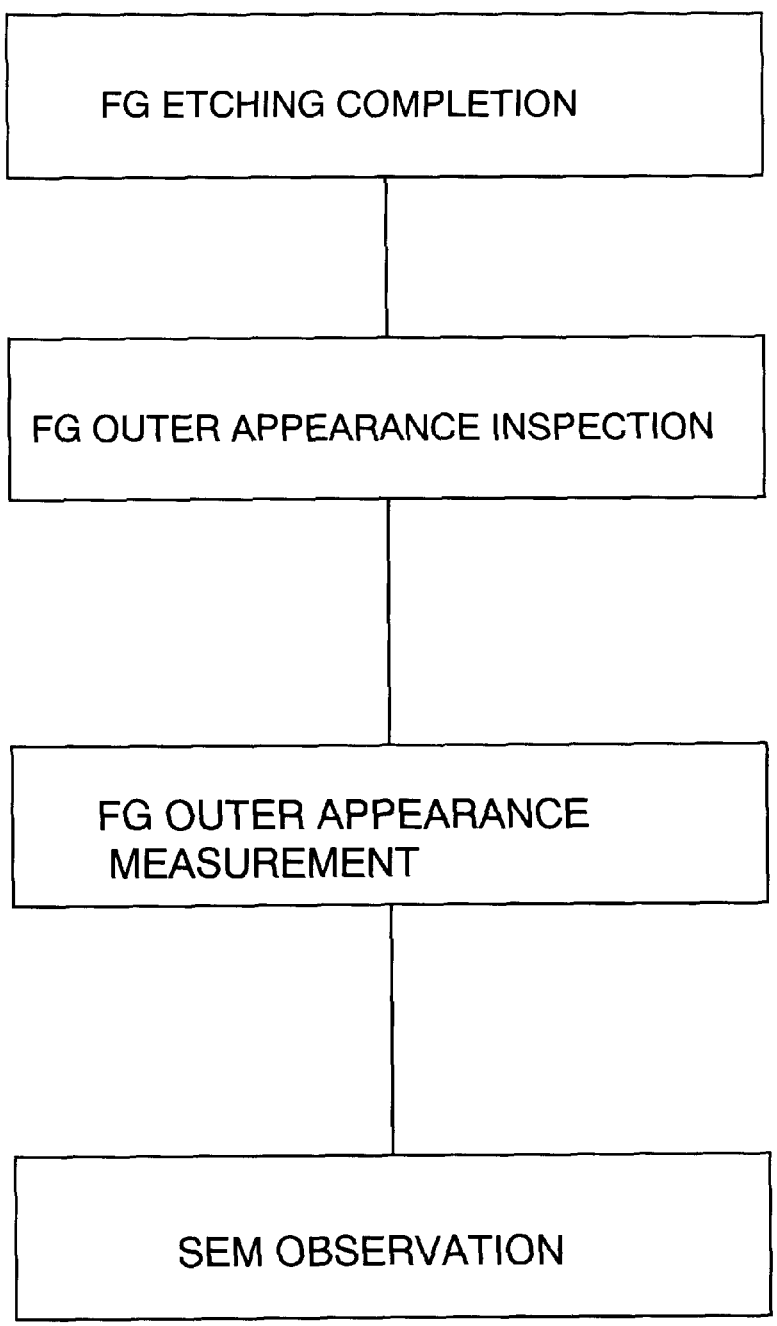
FIG. 15 is a flowchart showing an outer appearance inspection method according to the present invention.

FIG. 15 is a flowchart of an outer appearance inspection method. Scratch evaluation on scratch-doubt products is carried out by performing pattern recognition on the surfaces of product wafers by means of an outer appearance inspection. Further, a portion that differs from the pattern of the wafer regarded as a non-defective product is recognized as a defect, and the density of defects is calculated from the number of defects and the measurement area. This outer appearance inspection need not be performed on all the product wafers regarded as scratch-doubt products but may be performed on wafers respectively extracted from the lots of product wafers.

Next, the portion recognized as a defect by the outer appearance inspection is observed by an SEM, and the number of scratches enlarged by the hydrofluoric acid cleaning step is measured thereby to determine whether the product wafer is non-defective or defective.

Figure 16:
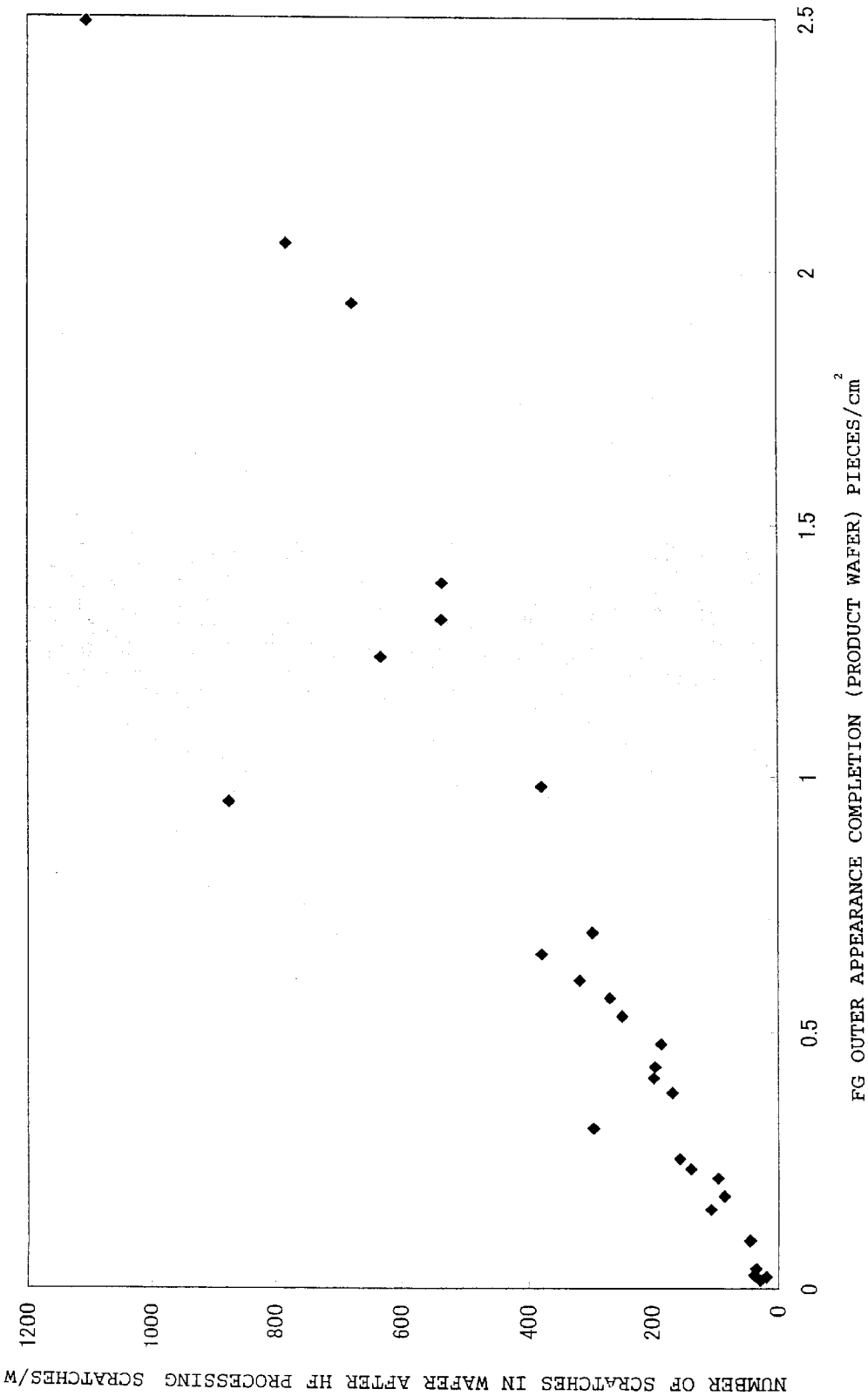
FIG. 16 is a graph showing a result of investigating an interrelation between scratch measurement which is carried out with use of a dummy wafer after chemical mechanical polishing processing and scratch measurement which is carried out with use of a product wafer after hydrofluoric acid cleaning processing.

FIG. 16 is a graph showing an interrelation between scratch measurement performed with use of a dummy wafer after chemical mechanical polishing processing and scratch measurement performed with use of a product wafer after hydrofluoric acid cleaning processing. The laser irradiation type defect inspection device (LS-6510) manufactured by HITACHI ELECTRONICS ENGINEERING CO., LTD. was used for the scratch measurement using the dummy wafer. The automatic wafer outer appearance inspection device (WI-890) manufactured by HITACHI TOKYO ELECTRONICS CO., LTD. was used for the outer appearance inspection of the product wafer.

Since a circuit pattern is formed on the surface of a product wafer, precision for detecting scratches is lower compared with scratch measurement using a dummy wafer. However, as shown in the figure, an interrelation is found between scratch measurement using a dummy wafer and scratch measurement using a product wafer. Effectiveness can thus be found in the micro scratch evaluation method of the present invention.

All the wafers of the lot which contains a product wafer determined as a defective product by the scratch measurement are regarded as defective products at this time point and are excluded from the mass production line. Meanwhile, all the wafers of the lot which contains a product wafer determined as a non-defective product by the scratch measurement were regarded as non-defective products and are conveyed to a next step of the mass-production line, together with product wafers which are not determined to be scratch-doubt products.

Figure 17:
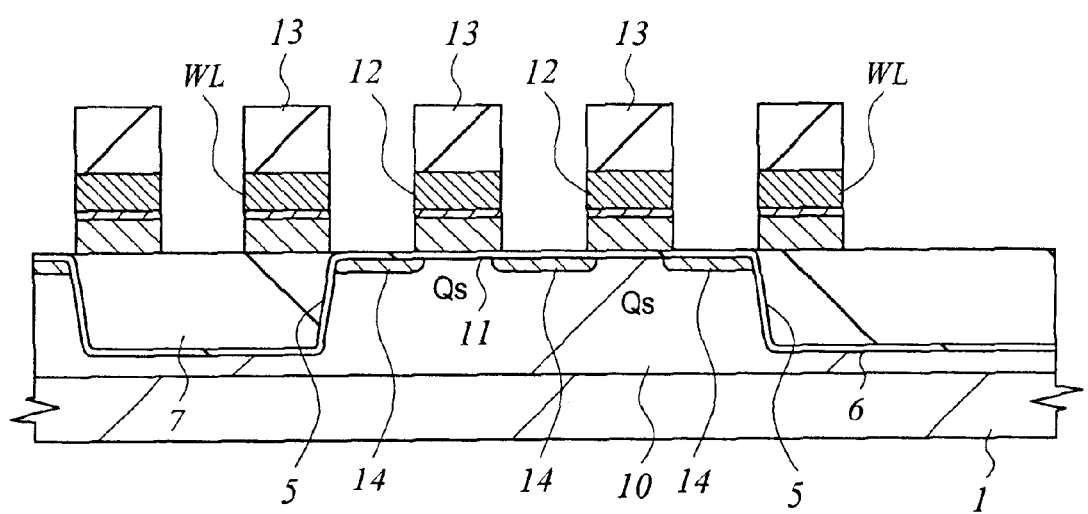
FIG. 17 is a cross-sectional view of a main part of a silicon substrate, showing the method of manufacturing a semiconductor integrated circuit device as the embodiment of the present invention.

Process after the outer appearance inspection step will be as follows. At first, as shown in FIG. 17, phosphorus (P) or arsenic (As) is ion-implanted into a p-type well 10 thereby to form an n-type semiconductor region 14 (source, drain). By the process up to this step, MISFET Qs for selecting memory cells of a DRAM are substantially completed.

Figure 18:
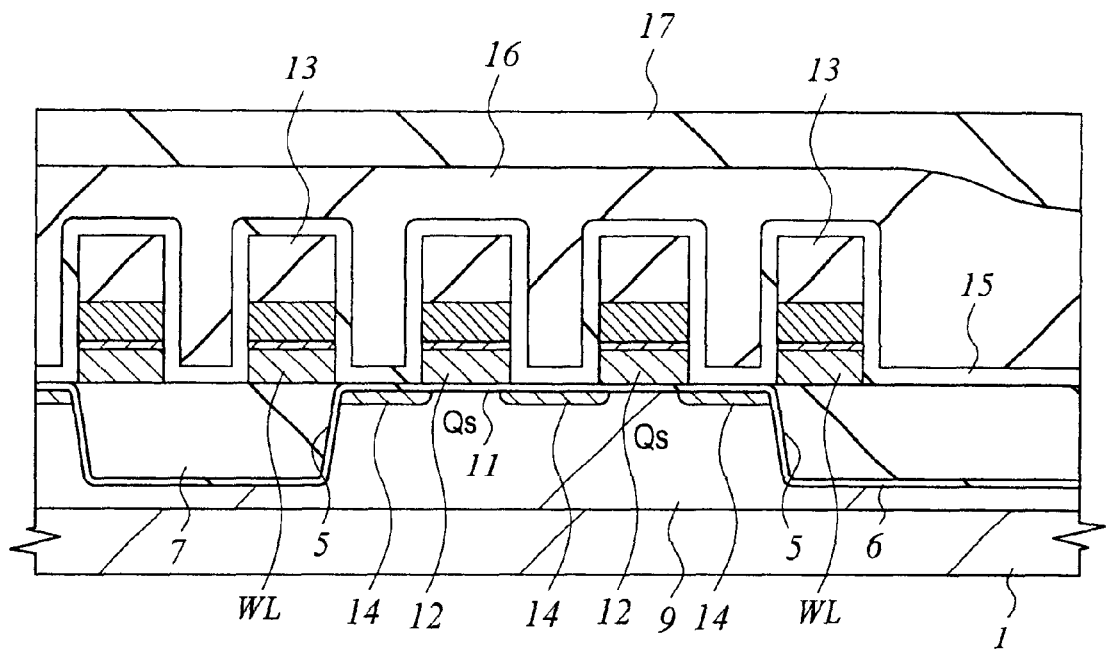
FIG. 18 is also a cross-sectional view of a main part of a silicon substrate, showing the method of manufacturing a semiconductor integrated circuit device as the embodiment of the present invention.

Next, as shown in FIG. 18, a silicon nitride film 15 is deposited on the substrate 1 by a CVD method, and subsequently, a spin-on glass film 16 is spin-coated on the silicon nitride film 15. Thereafter, a silicon oxide film 17 is deposited by CVD method at the upper part of the spin-on glass film 15.

Figure 19:
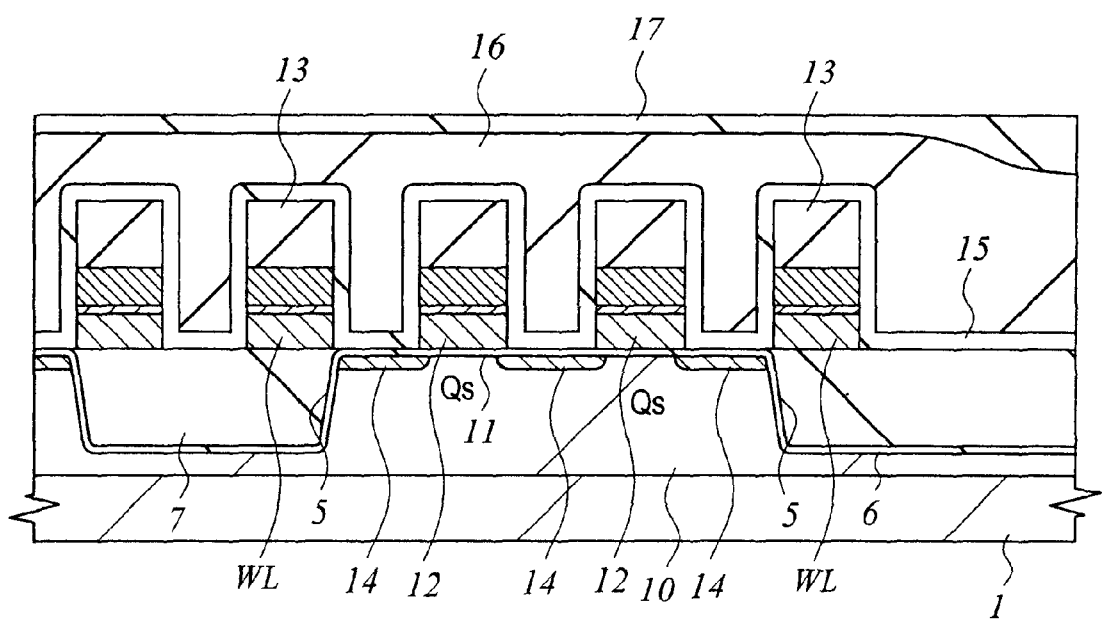
FIG. 19 is also a cross-sectional view of a main part of a silicon substrate, showing the method of manufacturing a semiconductor integrated circuit device as the embodiment of the present invention.

Next, as shown in FIG. 19, the silicon oxide film 17 is polished by a chemical mechanical polishing method and its surface is flattened. By this polishing step, micro scratches occur in the silicon oxide film 17 and partially reach the spin-on glass film 16 of the lower layer. By hydrofluoric acid cleaning performed in a next step, scratches on the spin-on glass film 16 are enlarged. Therefore, when plugs 20 are filled in contact holes 18 and 19 formed in the spin-on glass film 16 in a later step, the plugs 20 may be short-circuited to each other through the scratches. Evaluation of micro scratches caused by this chemical mechanical polishing step can be performed by the above-described evaluation method of the present invention.

That is, a dummy wafer is set at the top of product wafers and is subjected to polishing processing immediately after the polishing pad is repapered. Further, this dummy wafer is processed with diluted hydrofluoric acid, to enlarge micro scratches. The number of enlarged scratch patterns is measured. If the number of scratches is recognized to be on a non-defective level, chemical mechanical polishing is performed on product wafers. Alternatively, if the number of scratches which have occurred in the dummy wafer at the top of a lot is recognized to be on a defective level, product wafers subjected to chemical mechanical polishing processing between this dummy wafer and a preceding non-defective dummy wafer are regarded as scratch-doubt products (wafers in which the number of scratches may reach the non-defective level), and an outer appearance inspection is carried out by a step in which hydrofluoric acid processing is possible.

Figure 20:
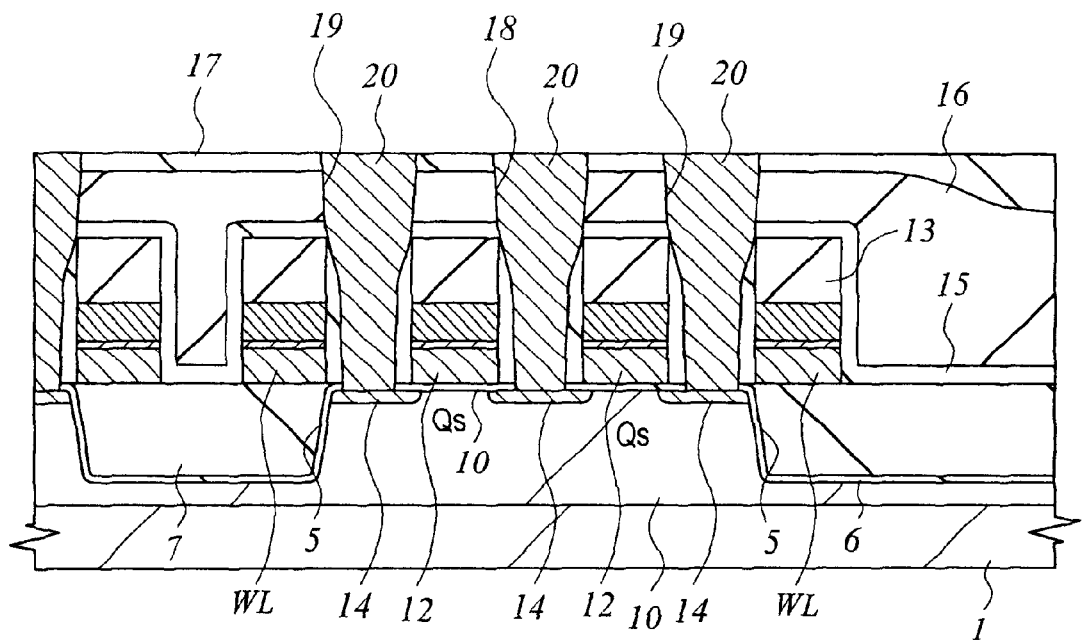
FIG. 20 is also a cross-sectional view of a main part of a silicon substrate, showing the method of manufacturing a semiconductor integrated circuit device as the embodiment of the present invention.

Next, as shown in FIG. 20, a silicon oxide film 17, a spin-on glass film 16, and a silicon nitride film 15 are dry-etched with a photoresist film (not shown) used as a mask, thereby to form contact holes 18 and 19 at the upper part of the n-type semiconductor region 14 (source, drain).

Next, the insides of the contact holes 18 and 19 are cleaned with hydrofluoric acid, and thereafter, an outer appearance inspection is carried out, and product wafers in which micro scratches which reach a defective level have been caused in the chemical mechanical polishing step of the silicon oxide film 17 are excluded from the mass-production line.

Next, plugs 20 are formed in the contact holes 18 and 19. To form the plugs 20, for example, a low-resistance polycrystal silicon film doped with phosphorus (P) is deposited inside the contact holes 18 and 19 and at the top of silicon oxide film 17. Thereafter, the unnecessary polycrystal silicon film above the silicon oxide film 16 is removed by dry-etching (or chemical mechanical polishing method).

Figure 21:
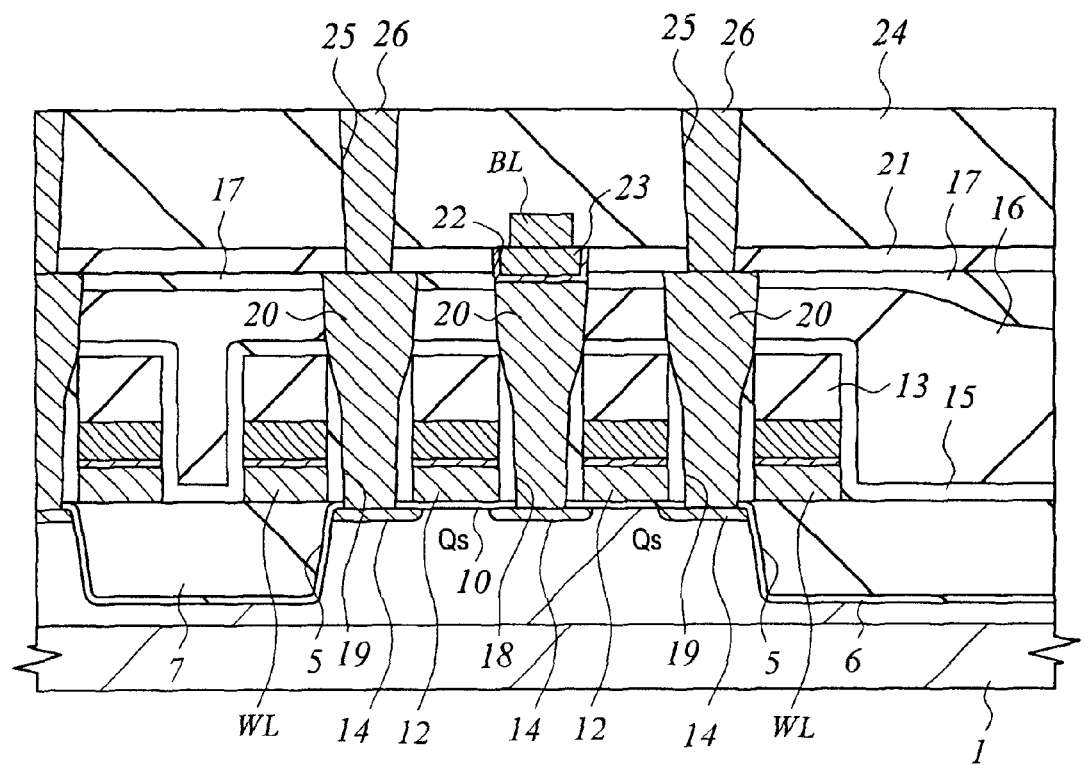
FIG. 21 is also a cross-sectional view of a main part of a silicon substrate, showing the method of manufacturing a semiconductor integrated circuit device as the embodiment of the present invention.

Next, as shown in FIG. 21, a silicon oxide film 17 is deposited at the upper part of the silicon oxide film 17 by a CVD method, and subsequently, the silicon oxide film 21 above the contact hole 18 is etched to form a through hole 22. Thereafter, a plug 23 is formed in the through hole 22. For example, the plug 23 is formed by depositing a TiN (titanium nitride) film and W (tungsten) film are deposited at the upper part of the silicon oxide film 21 and by thereafter removing the unnecessary W film and TiN film at the upper part of the silicon oxide film 21 by the chemical mechanical polishing method. Subsequently, the W film deposited at the upper part of the silicon oxide film 21 by a sputtering method is patterned to form a bit line BL at the upper part of the plug 23.

Next, a silicon oxide film 24 is deposited above the bit line BL by a CVD method, and subsequently, the silicon oxide film 24 above the contact hole 19 is etched to form a through hole 25. Thereafter, a plug 26 is formed in the through hole 25. To form the plug 26, for example, a low-resistance polycrystal silicon film doped with phosphorus (P) is deposited in the through hole 25 and on the silicon oxide film 24 by a CVD method, and thereafter, unnecessary silicon polycrystal film above the silicon oxide film 24 is removed by dry-etching (or chemical mechanical polishing method).

Next, as shown in FIG. 22, a silicon nitride film 27 is deposited above the silicon oxide film 24, and subsequently, a silicon oxide film 28 is deposited on the silicon nitride film 27. Thereafter, the silicon oxide film 26 and the silicon nitride film 27 thereunder are dry-etched with a photoresist film (not shown) used as a mask, thereby to form a groove 29 above the thorough hole 25. The lower electrode 30 of an information storage capacitive element C described later is formed along the inner wall of this groove. Therefore, in order to enlarge the surface area of the lower electrode 30 and the storage charge amount, the silicon oxide film 28 must be deposited with a large thickness.

Next, as shown in FIG. 23, an information storage capacitive element C comprising lower electrode 30, a capacity insulating film 31 and an upper electrode 32 is formed inside the groove 29. The lower electrode 30 is made of, for example, a low-resistance polycrystal silicon film doped with phosphorus (P), and the capacitive insulating film 31 is made of a tantalum oxide ($Ta_2O_5$) film. Also, the upper electrode 32 is made of a TiN film. By the process up to this step, memory cells constructed by memory cell selection MISFET Qs and an information storage capacitive element C connected in series therewith are completed.

In the above, the present invention made by the present inventor has been explained specifically on the basis of the embodiment of the invention. The present invention, however, is not limited to the embodiment described above but can be variously modified without deviating from the range of the subject matter of the invention.

An advantage obtained by representative one of the inventions disclosed in the present application will be briefly explained as follows.

According to the present invention, micro scratches caused in the chemical mechanical polishing step can be detected without making a breakdown inspection on product wafers which flow through a mass production process. It is therefore possible to improve the yield and reliability of semiconductor integrated circuit devices.

What is claimed is:

1. A method of manufacturing a semiconductor integrated circuit device, comprising:
   a step (a) of forming an insulating film on main surfaces of a plurality of first wafers which flow through a mass-production process;

a step (b) of preparing a dummy wafer for monitoring, on which a silicon-oxide-based insulating film is formed;

a step (c) of performing chemical mechanical polishing processing on the insulating films respectively formed on main surfaces of the plurality of first wafers and the dummy wafer;

a step (d) of performing etching processing on the insulating film of the dummy wafer with use of a solution containing hydrofluoric acid, after the step of performing the chemical mechanical polishing processing; and a step (e) of measuring a number of scratches on the insulating film of the dummy wafer subjected to the etching processing, thereby to manage the number of scratches formed in the insulating films of the plurality of first wafers in the step of performing the chemical mechanical polishing processing.

2. The method according to claim 1, wherein the step of performing the chemical mechanical polishing processing is a step of forming polished flattened insulating film separation grooves in the main surfaces.

3. The method according to claim 1, wherein the dummy wafer is a wafer in which the silicon-oxide-based insulating film is formed on a main surface subjected to mirror-finished-surface processing.

4. The method according to claim 1, wherein the step of performing the chemical mechanical polishing processing is carried out with use of polishing slurry containing silica as a main component.

5. The method according to claim 1, wherein the step of performing the chemical mechanical polishing processing is carried out by a sheet-by-sheet method.

6. A method of manufacturing a semiconductor integrated circuit device, comprising:

a step (a) of etching main surfaces of a plurality of first wafers which flow through a mass-production process, to form grooves for element separation;

a step (b) of forming a silicon-oxide-based insulating film having a film thickness greater than a depth of the grooves, on the main surfaces of the plurality of first wafers in which the grooves are formed;

a step (c) of preparing a dummy wafer for monitoring in which a silicon-oxide-based insulating film is formed;

a step (d) of performing chemical mechanical polishing processing on the insulating films respectively formed on main surfaces of the plurality of first wafers and the dummy wafer, thereby to form polished flattened insulating film separation grooves in the main surfaces of the plurality of first wafers;

a step (e) of performing etching processing on the insulating film of the dummy wafer with use of a solution containing hydrofluoric acid, after the step of performing the chemical mechanical polishing processing;

a step (f) of measuring a number of scratches in the insulating film of the dummy wafer subjected to the etching processing, thereby to manage the number of scratches caused in the insulating films of the plurality of first wafers in the step of performing the chemical mechanical polishing processing;

a step (g) of forming a first conductive film on the main surfaces of the plurality of first wafers in which the polished flattened insulating film separation grooves are formed, and of thereafter pattering the first conductive film, thereby to form gate electrodes of MISFETs on the main surfaces of the plurality of first wafers;

a step (h) of performing etching processing on the main surfaces of the plurality of first wafers on which the gate electrodes are formed, with use of a solution containing hydrofluoric acid; and a step (i) of performing an outer appearance inspection on those of the first wafers that are determined that the number of scratches of the insulating films can exceed a reference value, among the plurality of first wafers, thereby to measure the number of scratches caused in the insulating films of the first wafers in the step of performing chemical mechanical polishing processing.

7. The method according to claim 6, wherein the dummy wafer is a wafer in which the silicon-oxide-based insulating film is formed on a main surface subjected to mirror-finished-surface processing.

8. The method according to claim 6, wherein the step of performing the chemical mechanical polishing processing is carried out with use of polishing slurry containing silica as a main component.

9. The method according to claim 6, wherein the step of performing the chemical mechanical polishing processing is carried out by a sheet-by-sheet method.

10. The method according to claim 6, wherein the chemical mechanical polishing processing performed on the plurality of first wafers is carried out, with a silicon-nitride-based insulating film used as an etching stopper.

11. The method according to claim 6, wherein in the chemical mechanical polishing in the step (d), one same chemical mechanical polishing apparatus is used to perform sequentially chemical mechanical polishing processing on the plurality of first wafers and chemical mechanical polishing processing on the dummy wafer.

12. The method according to claim 11, wherein the step of performing the chemical mechanical polishing processing further includes:

a step (j) of performing chemical mechanical polishing processing on the dummy wafer;

a step (k) of performing etching processing on the insulating film of the dummy wafer with use of a solution containing hydrofluoric acid, after the step (j); and a step (l) of measuring the number of scratches in the insulating film of the dummy wafer subjected to the etching processing, after the step (k); and of performing chemical mechanical polishing processing on the plurality of first wafers if the number of scratches is equal to or less than a reference value or of changing a condition of the chemical mechanical polishing processing and repeating the steps (j) to (l) until the number of scratches comes to be equal to or less than the reference value if the number of scratches exceeds the reference value.

* * * * *